(12) United States Patent
Kido et al.

(10) Patent No.: US 7,671,964 B2
(45) Date of Patent: Mar. 2, 2010

(54) EXPOSURE APPARATUS, AND DEVICE MANUFACTURING METHOD

(75) Inventors: Chiharu Kido, Utsunomiya (JP); Hiroyuki Maruyama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 245 days.

(21) Appl. No.: 11/373,172

(22) Filed: Mar. 13, 2006

(65) Prior Publication Data

US 2006/0209275 A1 Sep. 21, 2006

(30) Foreign Application Priority Data

Mar. 18, 2005 (JP) ............................. 2005-078840

(51) Int. Cl.
*G03B 27/52* (2006.01)
*G05D 23/00* (2006.01)
(52) U.S. Cl. ........................................ 355/30; 165/296
(58) Field of Classification Search .................. 355/33, 355/53, 30; 165/296
See application file for complete search history.

(56) References Cited

U.S. PATENT DOCUMENTS

| 5,577,552 | A | * | 11/1996 | Ebinuma et al. ............ 165/296 |
| 6,762,516 | B2 | | 7/2004 | Maruyama .................... 310/12 |
| 7,201,016 | B2 | | 4/2007 | Maruyama .................... 62/475 |
| 2003/0159456 | A1 | * | 8/2003 | Cowans ...................... 62/259.1 |
| 2006/0209275 | A1 | | 9/2006 | Kido et al. ..................... 355/30 |
| 2006/0248919 | A1 | | 11/2006 | Maruyama .................... 62/475 |

FOREIGN PATENT DOCUMENTS

JP    2001-244179    9/2001

* cited by examiner

*Primary Examiner*—Alan A Mathews
*Assistant Examiner*—Mesfin T Asfaw
(74) *Attorney, Agent, or Firm*—Fitzpatrick, Cella, Harper & Scinto

(57) ABSTRACT

An exposure apparatus for exposing a substrate to light via a reticle. A cooling device cools first water supplied from a facility by use of second water supplied for the facility, in which a temperature of the second water to be supplied from the facility is lower than a temperature of the first water to be supplied from the facility, a first supply path supplies the first water from the facility to the cooling device, a second supply path supplies the second water from the facility to the cooling device, and a third supply path supplies the first water cooled by the cooling device from the cooling device to a heat source inside the exposure apparatus.

5 Claims, 4 Drawing Sheets

EXPOSURE APPARATUS, AND DEVICE MANUFACTURING METHOD

This application claims priority from Japanese Patent Application No. 2005-078840, filed Mar. 18, 2005, which is hereby incorporated by reference.

FIELD OF THE INVENTION AND RELATED ART

This invention relates to an exposure apparatus and a device manufacturing method. More particularly, the invention concerns an exposure apparatus having a temperature adjusting system and a device manufacturing method using such an exposure apparatus.

Device manufacturing apparatuses, such as a semiconductor exposure apparatus, include various heat sources, such as positioning stage driving means, electrical boards and laser oscillators, for example. It is, therefore, a critical matter to avoid a temperature rise of the surrounding ambience in exposure apparatuses due to such heat generating sources. More specifically, if the temperature of an ambience of a semiconductor exposure apparatus changes, it causes changes of a refractive index due to fluctuation of a gas along an exposure light path, or a local temperature rise or a temperature variation, which may cause non-uniform exposure and difficulties in achieving good precision positioning. Furthermore, it may cause thermal deformation of a substrate, such as a reticle or a wafer. In summary, this leads to difficulties in accomplishing high precision exposure transfer.

In order to meet this, various temperature adjusting mechanisms are used, such as a temperature adjusting mechanism for controlling a temperature rise or a temperature variation of a substrate, such as a reticle or a wafer, so as to maintain the substrate at a predetermined temperature, or a temperature adjusting mechanism for controlling a temperature rise or a temperature variation inside a chamber that surrounds an exposure apparatus, so as to maintain the inside of the chamber at a predetermined temperature. Referring now to FIG. 2, as an example of an exposure apparatus having such a temperature adjusting mechanism, one such as disclosed in Japanese Laid-Open Patent Application, Publication No. 2001-244179, will be explained.

The exposure apparatus denoted at 22 includes an exposure apparatus main assembly 15 having a function for exposing a substrate, such as a wafer through an original, such as a reticle, having a pattern formed thereon, as well as a gas temperature adjusting mechanism 21 for adjusting the temperature of a gas inside a chamber 20 that surrounds the exposure apparatus main assembly 15. The chamber 20 that surrounds the exposure apparatus main assembly is provided with a gas-flow inlet port 19 and a gas-flow outlet port 14 at its upper and lower portions, respectively. A gas having been adjusted to a predetermined temperature by the gas temperature adjusting mechanism 21 is supplied through the upper gas-flow inlet port 19, and it flows downwardly through the exposure apparatus main assembly 15, as depicted by arrows. Finally, it is discharged outwardly through the gas-flow outlet port 14. The gas that flows inside the chamber 20 and through the exposure apparatus main assembly 15, as depicted by arrows in the drawing, functions to remove, by radiation, heat which is generated from heat generation sources of the exposure apparatus main assembly 15, so as to maintain the gas inside the chamber 20 at a predetermined temperature.

The gas temperature adjusting mechanism 21 comprises a cooling device 3 for carrying out heat exchange of a gas discharged from the gas-flow outlet port 14 of the chamber 20, by use of cooling water, a base heater 28 for preheating a sufficiently cooled gas up to a predetermined temperature, so as to reduce a temperature difference with respect to a temperature-adjustment target temperature, and a high-sensitivity base heater 29 for carrying out precision temperature adjustment with regard to the temperature-adjustment target temperature, these components being connected successively by use of pipe flowpassage means 30. Furthermore, there are a temperature sensor 6 for measuring the temperature of the gas having been preheated by the base heater 28, and another temperature sensor 24 for measuring the gas having been precisely temperature-adjusted by the high-sensitivity base heater 29 and supplied into the chamber 20, these sensors being disposed at the exit side of the base heater 28 and within the chamber 20, respectively. The base heater 28 and the high-sensitivity base heater 29 are controlled on the basis of measurements by the temperature sensors 6 and 24.

In a conventional temperature adjusting mechanism 21 of the exposure apparatus 22, such as described above, the gas discharged out of the chamber 20 or outside air supplied thereinto through appropriate filtering is once cooled by means of the cooling device 3 arranged to perform heat exchange by use of cooling water, for example. The gas sufficiently cooled thereby is then preheated by means of the base heater 28 up to a predetermined temperature. Furthermore, the thus preheated gas is then precisely temperature-adjusted by the high-sensitivity base heater 29 to a predetermined temperature-adjustment goal temperature. After this, the gas is supplied into the chamber 20. During this process, a controller unit 13a operates to control the operation of the base heater 28 and the high-sensitivity base heater 29 on the basis of the results of measurement of the gas temperatures by the temperature sensors 6 and 24.

The gas, having been adjusted to a predetermined temperature by means of the gas temperature adjusting mechanism 21, is caused by a fan 5 to pass through a filter 25 and, after that, it is supplied into the chamber 20. The gas flows, as depicted by arrows, along the exposure apparatus main assembly 25 that includes a reticle stage 26 and wafer stage 27. During this process, the gas absorbs or eliminates the heat generated in the exposure apparatus main assembly 15 so as to keep the ambience surrounding the exposure apparatus main assembly 15 at a constant temperature, thereby to assure good exposure precision.

As regards cooling water 31, initially, it is supplied to the cooling device 10 and, by this cooling device 10, the cooling water 31 is cooled to a predetermined temperature. Here, the cooling device 10 is controlled on the basis of a temperature sensor 11. The temperature sensor 11 is provided at the exit of the cooling device 10 and, on the basis of the result of measurement by this temperature sensor 11, a controller unit 13b controls the cooling device 10, so that a cooling medium can be cooled to a predetermined temperature. After being cooled to a predetermined temperature by the cooling device 10, the cooling water 31 is supplied to a heating device 2. By this heating device 2, the cooling water is heated to a predetermined temperature. There is a temperature sensor 12 at the exit of the heating device 2 and, on the basis of the result of measurement by this temperature sensor 2, the controller unit 13b controls the heating device 2 so that the cooling medium is heated to a predetermined temperature. The heating device 2 is controlled by the controller unit 13b on the basis of the temperature sensor 12. The cooling water, thus precisely temperature-controlled, is supplied into the exposure apparatus major assembly 15, to eliminate heat, by sufficient radiation, generated from various heat generation sources of the exposure apparatus main assembly 15, such as the reticle stage 26 and the wafer stage 27, for example. By adjusting or cooling the temperatures of various components of the exposure apparatus main assembly 15, the temperature of the exposure apparatus main assembly 15 can be stabilized. With this procedure, precise exposure is assured.

In semiconductor exposure apparatuses, exposure non-uniformness should be avoided, and also, very high positioning precision should be accomplished. To this end, it is critically important to adjust the gas temperature at a high resolving power. Additionally, fast operation is required more and more, and the power consumption is increasing. On the other hand, the importance of saving energy is becoming notable, and reducing the power consumption is required in this respect. While a stage is becoming faster in speed and larger in size, the power consumption should be kept even as before or smaller than before.

However, in conventional temperature adjusting mechanisms in semiconductor exposure apparatuses, since the exposure apparatus itself is large in size, the space to be temperature adjusted (that is, the chamber that surrounds the exposure apparatus main assembly) is huge, and thus, the temperature adjusting mechanism is also large in size. Furthermore, since the capacity of the cooling device of the temperature adjusting mechanism cannot be made sufficiently variable, temperature adjustment using a heater is carried out. The capacity of the cooling device is, therefore, generally determined with reference to the heat generation amount in a state in which the exposure apparatus main assembly is sufficiently operating. It is, therefore, necessary to use a heater that has a capacity necessary for raising the temperature in accordance with that capacity of the cooling device. For this reason, both the cooling device and the heater to be used must have a large capacity. This makes it very difficult to reduce the power consumption.

SUMMARY OF THE INVENTION

It is accordingly an exemplifying object of the present invention to provide an exposure apparatus which can reduce the power consumption, particularly with respect to temperature adjustment.

In accordance with an aspect of the present invention, to achieve the above object, there is provided an exposure apparatus for exposing a substrate through a reticle, the exposure apparatus comprising a cooling device configured to cool first water supplied from a facility by use of second water supplied from the facility and having a temperature lower than that of the first water, and a supplying system for supplying water cooled by the cooling device, to a heat source inside the exposure apparatus.

In accordance with another aspect of the present invention, there is provided a device manufacturing method, comprising the steps of exposing a substrate to light through a reticle by use of the exposure apparatus as discussed above, developing the exposed substrate, and processing the developed substrate to produce a device.

In accordance with a further aspect of the present invention, there is provided an exposure apparatus for exposing a substrate through a reticle, the apparatus comprising a chamber in which an exposure process is to be carried out, a circulation system configured to circulate a gas through the chamber, a supplying system configured to supply water, supplied from a facility, to a heat source inside the exposure apparatus, and a heat exchanger configured to perform heat exchange between a gas discharged out of the chamber by the circulation system and the water to be supplied to the heat source by the supplying system.

In accordance with a yet further aspect of the present invention, there is provided a device manufacturing method, comprising the steps of exposing a substrate to light through a reticle by use of the exposure apparatus as just mentioned above, developing the exposed substrate, and processing the developed substrate to produce a device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings. Specifically, the description will be made of an example of an exposure apparatus, such as a device manufacturing apparatus.

[Embodiment 1]

An exposure apparatus according to a first embodiment of the present invention, which includes a temperature adjusting mechanism (system) structured in accordance with the present invention, will now be explained in conjunction with FIG. 1, which shows a general structure of the same.

Figure 1:
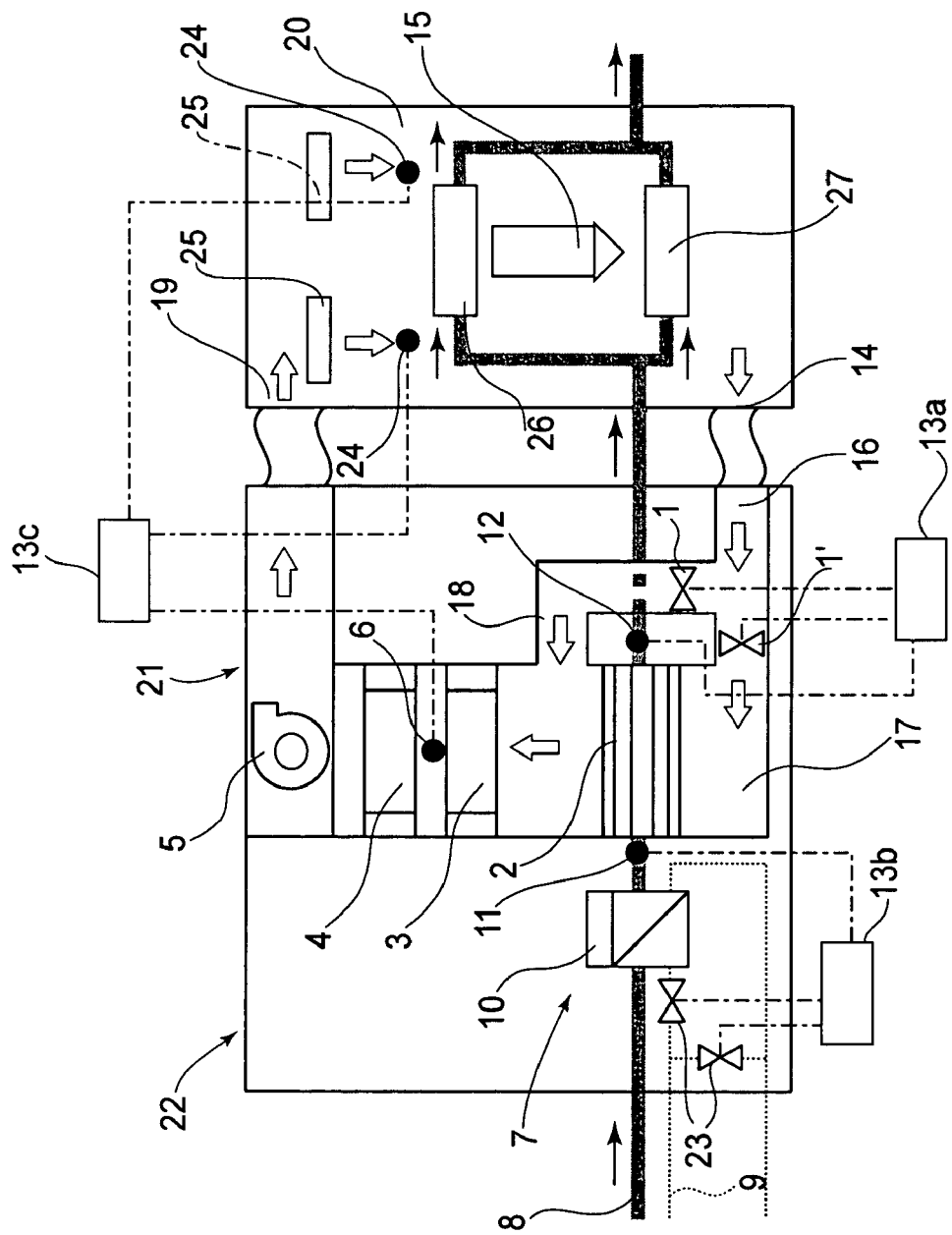
FIG. 1 is a schematic view of a general structure of an exposure apparatus having a temperature adjusting mechanism (system) according to a first embodiment of the present invention.
Figure 2:
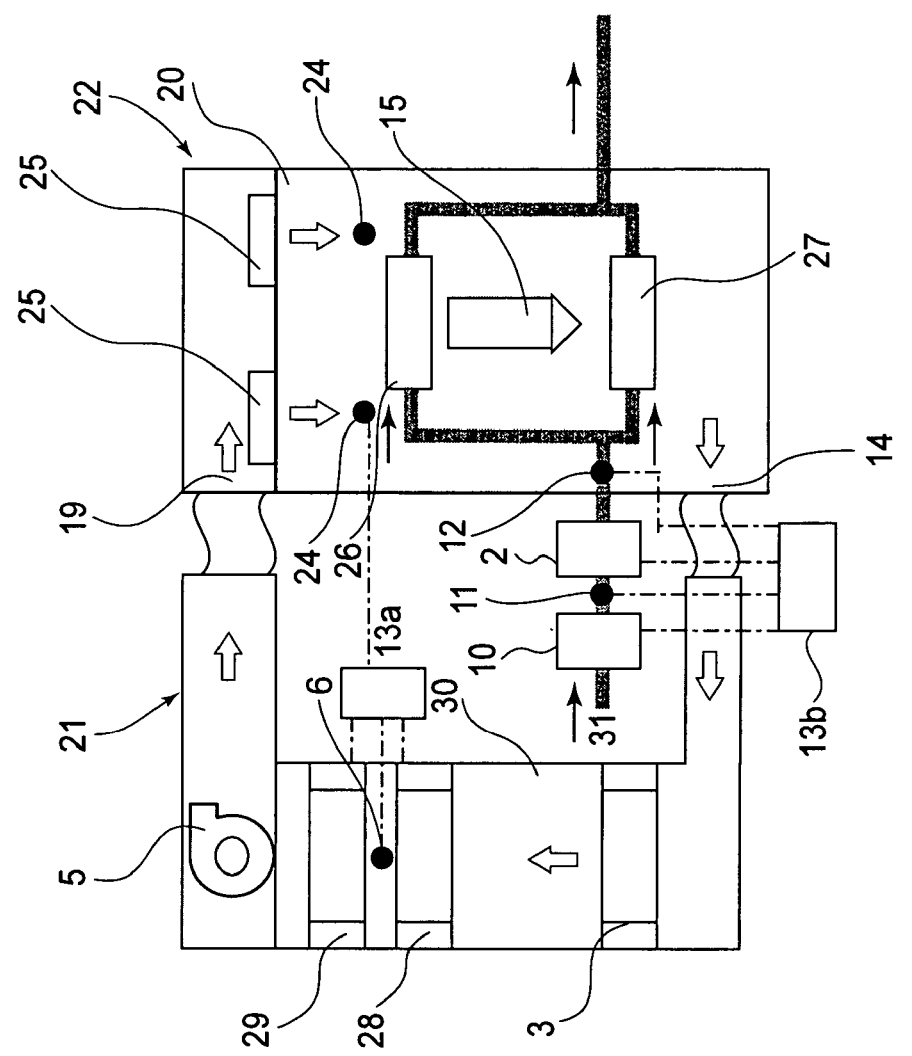
FIG. 2 is a schematic view of a general structure of an exposure apparatus having a conventional temperature adjusting mechanism.

In FIG. 1, the exposure apparatus denoted at 22 comprises an exposure apparatus main assembly 15 arranged to transfer a pattern of an original, such as a reticle onto a substrate, such as a wafer, a chamber 20 that surrounds the exposure apparatus main assembly 15, and a gas temperature adjusting mechanism (system) 21 for adjusting the temperature of a gas inside the chamber 20.

In this exposure apparatus 22, the chamber 20, which surrounds the exposure apparatus main assembly 15, is provided with a gas-flow inlet port 19 and a gas-flow outlet port 14, which are formed in upper and lower portions of the chamber, respectively. The structure functions so that a gas, having been adjusted to a predetermined temperature by means of the gas temperature adjusting mechanism (system) 21, is supplied through the upper gas-flow inlet port 19, and the gas flows along the exposure apparatus main assembly, as depicted by arrows. After this, the gas is discharged outwardly through the gas-flow outlet port 14. The gas that flows through the exposure apparatus main assembly 15, as depicted by the arrow functions, to eliminate, on the basis of radiation, heat generated from heat generation sources of the exposure apparatus main assembly 15, to thereby maintain the gas temperature inside the chamber 20 at a predetermined temperature.

The gas temperature adjusting mechanism 21 comprises a butterfly valve (bypass valve) 1 for bypassing a gas discharged out through the gas-flow outlet port 14 of the chamber 20, and another butterfly valve 1' for adjusting the flow rate of a gas to be discharged through the gas-flow outlet port 14. The gas temperature adjusting mechanism 21 further comprises a heating device 2 for performing heat exchange to the gas discharged from the chamber 20 with water, which is supplied from a factory facility, to thereby heat the same to a predetermined temperature, and a cooling device 3 for cooling the gas having been heat-exchanged with the water 8 supplied from the factory facility. The gas temperature adjusting mechanism further comprises another heating device 4 for performing precise temperature adjustment to the gas to control the same to a temperature-adjustment goal temperature, and a fan (blower) 5 for circulating the gas. These components are connected successively.

On the other hand, there is a cooling medium temperature adjusting mechanism (system) 7 that comprises a cooling device 10 for performing heat exchange to the water 8 supplied from the factory facility by use of cooling water 9, which is supplied from the factory facility, thereby to cool the former to a predetermined temperature, and a heating device 2 for performing heat exchange to the water 8 supplied from the factory facility by use of the gas discharged from the chamber 20, thereby to heat the water to a predetermined temperature, these components being communicated successively. The amount of heat exchange at the heating device 2 can be controlled by controlling the amount of a gas to be discharged from the chamber 20 and going to flow into the heating device 2 by use of butterfly valves 1 and 1' disposed after the chamber exit port.

The cooling medium temperature adjusting mechanism 7 is provided with a temperature sensor 11 for measuring the temperature of the cooling medium at the downstream side of the cooling device 10, as well as a temperature sensor 12 for measuring the temperature of the cooling medium having been temperature adjusted by the heating device 2 and flowing therefrom. These temperature sensors are connected to control means 13 (more specifically, to respective controller units 13a and 13b). The control means 13 is configured to control the butterfly valves 1 and 1' on the basis of the temperatures to be detected, respectively, by the temperature sensors 11 and 12 at respective positions. These butterfly valves 1 and 1' may preferably be driven to ensure that the gas volume is unchanged, regardless of a change in pressure loss of the gas resulting from the degree of opening of the valve.

On the other hand, the gas temperature adjusting mechanism 21 is provided with a temperature sensor 6 for measuring the temperature of a gas at the downstream side of the cooling device 3, as well as a temperature sensor 24 for measuring the temperature of a gas flowing out from the heating device 4 and performing temperature adjustment of the chamber space. These temperature sensors are connected to a controller unit 13c. This controller unit is configured to control the cooling device 3, the heating device 4, and the butterfly valve 1 on the basis of the temperatures measured, respectively, by the temperature sensors 6 and 24 at respective positions.

In an exposure apparatus having one of or both of the gas temperature adjusting mechanism 21 and the cooling medium temperature adjusting mechanism 7, the gas discharged outwardly through the gas-flow outlet port 14 has a high temperature, since it has absorbed heat generated from the exposure apparatus main assembly 15 and, in such a high-temperature state, the gas flows into the pipe flowpassage 16. First of all, it is bypassed. Here, the bypass amount can be adjusted by the butterfly valves 1 and 1', which are controlled by the control means 13a. The gas is directed through a pipe flowpassage 17 into the heating device 2. Simultaneously with this, the gas flows into a bypass flowpassage 18.

The high-temperature gas introduced from the pipe flowpassage 17 into the heating device 2 is temperature-adjusted by use of the water 8 supplied from the factory facility and, thereafter, it is supplied into the cooling device 3. The gas supplied to the cooling device 3 is cooled to a predetermined temperature in accordance with a control signal from the controller unit 13c, and then it is supplied toward the fan 5. Here, as regards the location of the fan 5 placement, it is not restricted to a position after the heating device 4.

The precisely temperature-adjusted gas is then supplied toward the gas-flow inlet port 19. The gas having been adjusted to a temperature adjustment goal temperature enters the gas-flow inlet port 19 and passes through a filter, and then it is supplied into the chamber 20. The supplied gas functions to eliminate, on the basis of sufficient radiation, the heat generated from various heat generation sources in the exposure apparatus main assembly 15, to adjust or cool the temperatures at various portions inside the chamber 20 and thereby to stabilize the ambience inside the chamber 20. With this procedure, good precision exposure operation is assured.

On the other hand, the water 8 supplied from the factory facility is, first of all, supplied to the cooling device 10. The water 8 supplied from the factory facility is then cooled by the cooling device 10 to a predetermined temperature. This cooling process is based on heat exchange, through a heat exchanger, with cooling water 9, which is supplied from the factory facility, as well. Here, the amount of heat exchange between the water 8 supplied from the factory facility and the cooling water 9, also supplied from the factory facility, is controlled by the controller unit 13b.

There is a temperature sensor 11 at the exit of the cooling device 10. The controller means 13b controls a flow-rate adjusting valve 23 on the basis of the result of measurement through the temperature sensor 11, so that the water 8, supplied from the factory facility, is cooled to a predetermined temperature.

The water thus adjusted by the cooling device 10 to a predetermined temperature is then supplied to the heating device 2. In this heating device 2, the water is heat-exchanged with the gas discharged from the chamber 20, whereby the water is heated to a predetermined temperature. The amount of heat exchange of the same with the gas discharged from the chamber 20 can be controlled on the basis of the flow rate of the gas, which can be adjusted by controlling the butterfly valves 1 and 1'. The control of the butterfly valves 1 and 1' is carried out by the control unit 13a on the basis of the result of measurement through the temperature sensor 12.

As an alternative, the water 8 supplied from the factory facility may be heated by the heating device 2 to a predetermined temperature and then cooled by the cooling device 10 to a predetermined temperature.

The water 8 having been supplied from the factory facility and having been precisely temperature-adjusted is supplied into the exposure apparatus main assembly 15. It functions to eliminate, by sufficient radiation, any heat generated from various heat generation sources of the exposure apparatus main assembly 15, to adjust or cool temperatures at various locations in the exposure apparatus main assembly 15, and to thereby stabilize the temperature of the exposure apparatus main assembly 15. With this procedure, good precision exposure is assured.

In the exposure apparatus 22 having cooling medium temperature adjusting mechanism 27 and gas temperature adjusting mechanism 21 according to this embodiment of the present invention, as described hereinbefore, the cooling of the exposure apparatus main assembly 15 is carried out by use of water 8 supplied from the factory facility. On the other hand, cooling water 9 supplied from the factory facility and waste heat of the gas discharged from the chamber 20 into the pipe flowpassage 17 are used to perform temperature adjustment of the water supplied from the factory facility. With this arrangement, the ambience of exposure apparatus main assembly 15 can be temperature-adjusted very precisely. In addition to this, cooling devices and heating devices of the temperature adjusting mechanism can be made smaller in size. This accomplishes both energy saving and cost saving.

[Embodiment 2]

Next, an embodiment of a device manufacturing method, which uses an exposure apparatus according to the first embodiment described above, will be explained as a second embodiment of the present invention.

Figure 3:
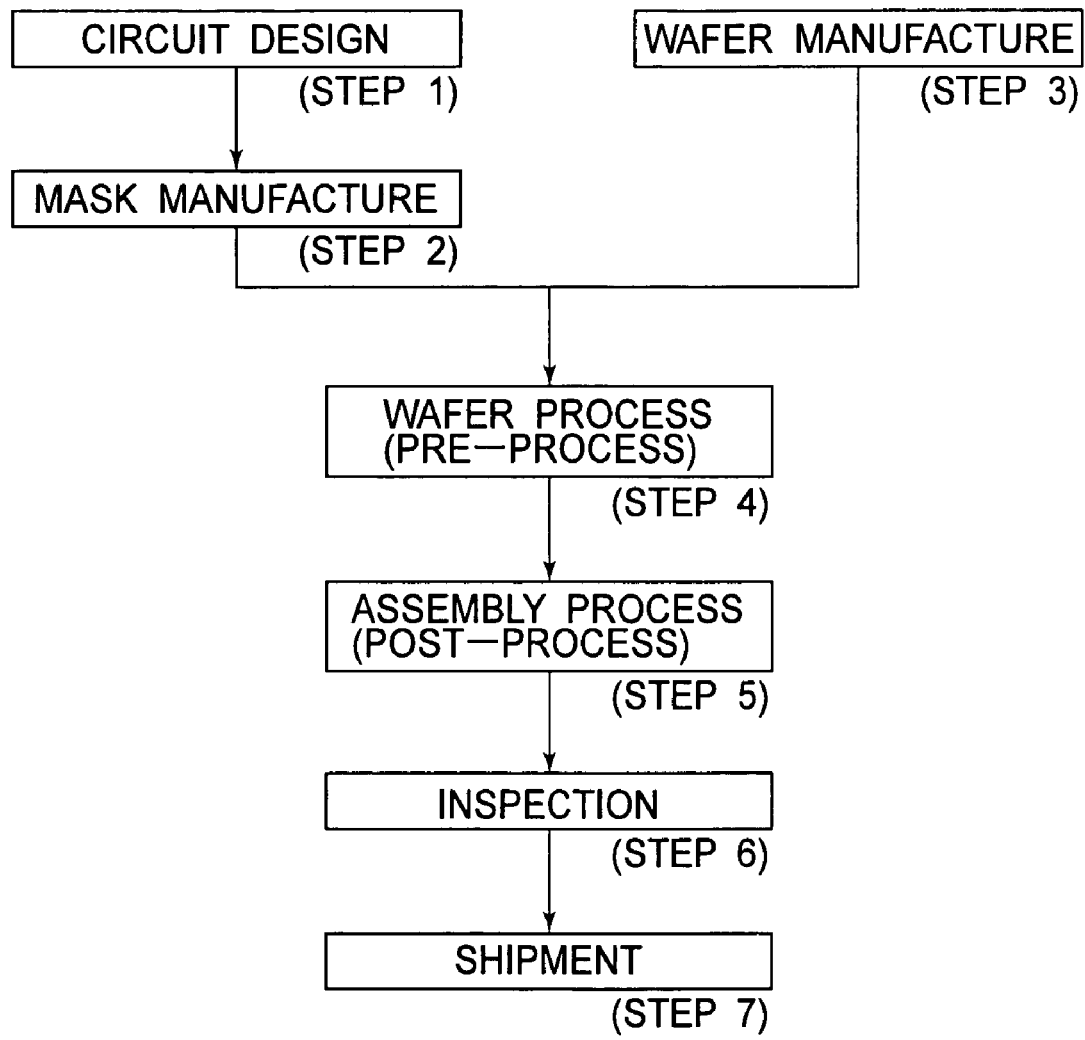
FIG. 3 is a flow chart for explaining semiconductor device manufacturing processes.

FIG. 3 is a flow chart for explaining the procedure of manufacturing various microdevices, such as semiconductor chips (e.g., ICs or LSIs), liquid crystal panels, CCDs or thin film magnetic heads, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembly step, which is called a post-process, wherein the wafer having been processed at step 4 is formed into semiconductor chips. This step includes an assembly (dicing and bonding) process and a packaging chip (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 4:
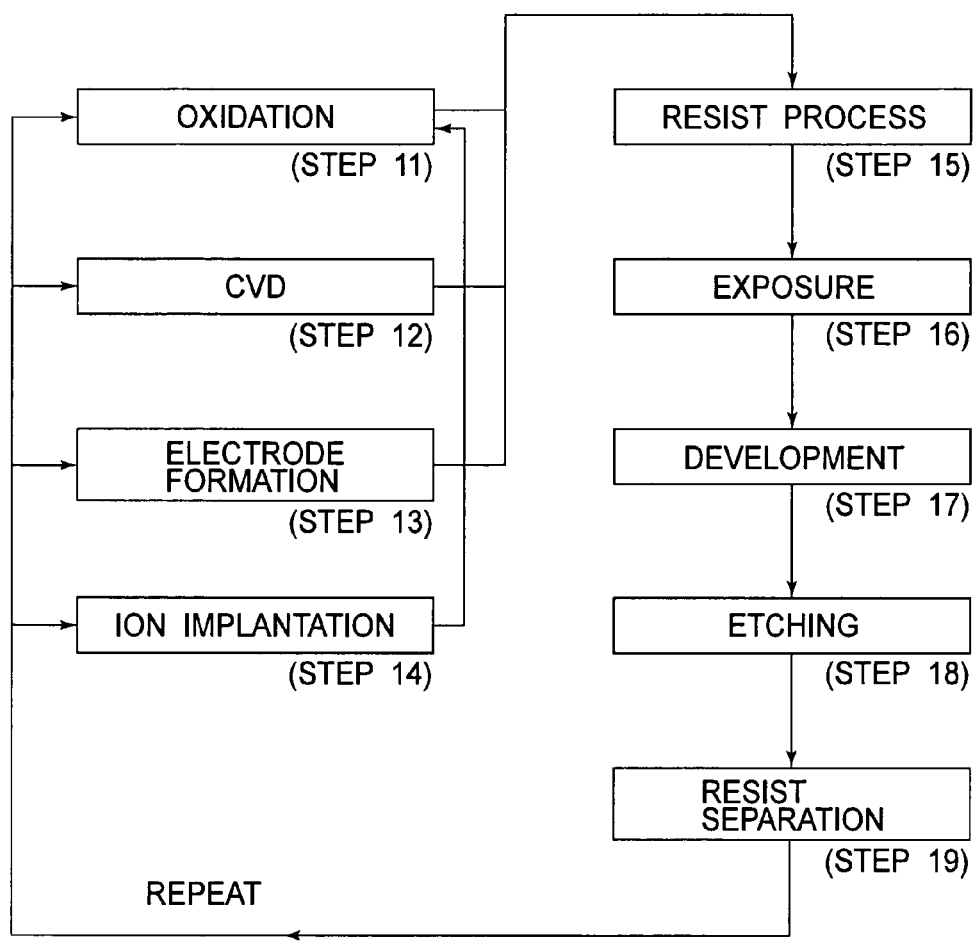
FIG. 4 is a flow chart for explaining details of a wafer process in the procedure shown in FIG. 3.

FIG. 4 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with these processes, high-density microdevices, which are difficult to be produced conventionally, can be manufactured stably and at a reduced cost.

In accordance with the embodiments of the present invention as described hereinbefore, a heat generating portion of an exposure apparatus or an exposure ambience of the same can be temperature controlled with very good precision. Furthermore, a cooling device or a heater of a temperature adjusting system can be made smaller in size. Thus, both energy saving and cost saving can be well accomplished.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to light via a reticle, the apparatus comprising:
    a chamber in which the substrate is exposed to light via the reticle;
    an adjusting mechanism configured to circulate a gas through the chamber to adjust a temperature of a gas inside the chamber;
    a cooling device configured to cool first water supplied from a factory facility by use of second water supplied from the factory facility, a temperature of the second water to be supplied from the factory facility being lower than a temperature of the first water to be supplied from the factory facility;
    a first supply path configured to supply the first water from the factory facility to the cooling device;
    a second supply path configured to supply the second water from the factory facility to the cooling device; and
    a third supply path configured to supply the first water cooled by the cooling device from the cooling device to a heat source inside the chamber, and configured so that the first water in the third supply path exchanges heat with a gas discharged from the chamber by the adjusting mechanism, to cool the discharged gas, the cooled gas being supplied to the chamber by the adjusting mechanism.

2. An exposure apparatus according to claim 1, wherein the cooling device includes a heat exchanger configured to perform heat exchange between the first water and the second water.

3. An apparatus according to claim 1, further comprising a heating device configured to heat the first water cooled by the cooling device.

4. An apparatus according to claim 1, further comprising, as the heat source, a reticle stage configured to hold the reticle and to be moved, and a substrate stage configured to hold the substrate and to be moved.

5. A method of manufacturing a device, the method comprising:
    exposing a substrate to light via a reticle by use of an exposure apparatus defined in claim 1;
    developing the exposed substrate; and
    processing the developed substrate to manufacture the device.

* * * * *